(12) United States Patent
Kinoshita et al.

(10) Patent No.: US 6,365,828 B1
(45) Date of Patent: Apr. 2, 2002

(54) ELECTROMAGNETIC INTERFERENCE SUPPRESSING DEVICE AND CIRCUIT

(75) Inventors: Yasushi Kinoshita; Hiroshi Wabuka; Shiro Yoshida; Hirokazu Tohya; Toru Mori; Atsushi Ochi, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/691,257

(22) Filed: Oct. 19, 2000

(30) Foreign Application Priority Data

Oct. 22, 1999 (JP) .......................................... 11-300396

(51) Int. Cl.$^7$ .............................. H05K 9/00; H04B 3/30
(52) U.S. Cl. ...................... 174/35 R; 333/12; 333/181
(58) Field of Search ......................... 174/35 R, 35 MS; 361/761, 763, 792, 794, 795, 800, 816, 818; 333/12, 181, 185; 336/200

(56) References Cited

U.S. PATENT DOCUMENTS

| | | | | | |
|---|---|---|---|---|---|
| 4,751,479 | A | * | 6/1988 | Parr | 333/12 |
| 4,796,079 | A | * | 1/1989 | Hettiger | 357/68 |
| 5,497,129 | A | * | 3/1996 | Mantese et al. | 333/182 |
| 5,914,644 | A | * | 6/1999 | Carter et al. | 333/12 |
| 6,002,593 | A | * | 12/1999 | Tohya et al. | 361/765 |
| 6,075,211 | A | * | 6/2000 | Toyha et al. | 174/255 |
| 6,091,310 | A | * | 7/2000 | Utsumi et al. | 333/12 |
| 6,198,362 | B1 | * | 3/2001 | Harada et al. | 333/12 |

FOREIGN PATENT DOCUMENTS

| | | |
|---|---|---|
| JP | 2734447 | 1/1998 |
| JP | 10-321973 | 12/1998 |
| JP | 2877132 | 1/1999 |
| JP | 11-87880 | 3/1999 |
| JP | 11-261181 | 9/1999 |
| JP | 11-261238 | 9/1999 |

* cited by examiner

Primary Examiner—Dean A. Reichard
Assistant Examiner—Carmelo Oliva
(74) Attorney, Agent, or Firm—Sughrue Mion, PLLC (57) ABSTRACT

The electromagnetic interference suppressing device of the present invention includes a plurality of connection layers and ground layers formed of a conductive material. The connection layers and the ground layers are alternately layered. Insulating layers, formed of an insulating material, intervene between the neighboring connection layers and ground layers. The odd connection layers counting from the bottom and the connection layers just above those layers are electrically connected at the same end. The even connection layers counting from the bottom and the connection layers just above those layers are electrically connected at the same end opposite to the odd connection-layered end. The bottommost connection layer is connected to a first signal terminal. The uppermost connection layer is connected to a second signal terminal. The ground layer is connected to a ground terminal.

13 Claims, 11 Drawing Sheets

ELECTROMAGNETIC INTERFERENCE SUPPRESSING DEVICE AND CIRCUIT

BACKGROUND OF THE INVENTION

1. Field of the Invention

The present invention relates to an electromagnetic interference suppressing device and a circuit for suppressing electromagnetic noise arising in the periphery of a semiconductor circuit mounted on a multilayer printed circuit board.

This application is based on Japanese Patent Application No. 11-300396, the contents of which are incorporated herein by reference.

2. Description of the Related Art

In recent years, as the operating speeds of semiconductor products such as transistors, ICs, and LSIs have increased, there have been the serious problems of EMI (Electro-Magnetic Interference) which causes malfunctions in electronic devices containing the semiconductor devices or in other electronic devices.

For example, in recent personal computers, the internal clock speed of the CPU (Central Processing Unit) has increased to 650 MHz, and is expected to further increase to the order of GHz. Signal lines or power supply lines of LSIs, driven at high frequencies, contain high frequency components operating above several GHz, which regularly causes electromagnetic noise at high frequencies. Therefore, in multilayer printed circuit boards on which a number of semiconductor devices are mounted without an appropriate means for reducing the noise, the connections on the board act as antennae, and electromagnetic noise is emitted as radio waves, which may cause malfunctions in electronic devices or in other electronic devices.

EMI is mainly caused by electromagnetic radiation due to an electric current (roundabout current) which is called common mode, caused by parasitic mutual inductance or parasitic capacitance, or by a high frequency current flowing in the power supply lines. The cause of EMI is, however, complex, and there is no effective countermeasure which is applied in proximity of the sources.

A technique has been proposed for providing an electromagnetic noise absorption layer, for absorbing electromagnetic noise, on the upper and lower sides of the printed circuit board, or for providing the electromagnetic noise absorption layer as an internal layer. The technique cannot control the occurrence of the electromagnetic noise, and its effectiveness is limited. In general, a metal case, as a measure for preventing electromagnetic noise, is used to shield the entire electronic device.

In a general multilayer printed circuit board, the power source layer, the ground layer, and signal layers are layered with an intervening insulating material. In a multilayer printed circuit board shown in FIG. 9, an IC/LSI803, which is a source of a high frequency source current, is connected between a power supply line of a source layer 801 of the multilayer printed circuit board 805, and a ground line of a ground layer 802. A decoupling capacitor 804 is located in proximity of the IC/LSI803, and is connected in parallel between the source layer and the ground layer.

Figure 9:
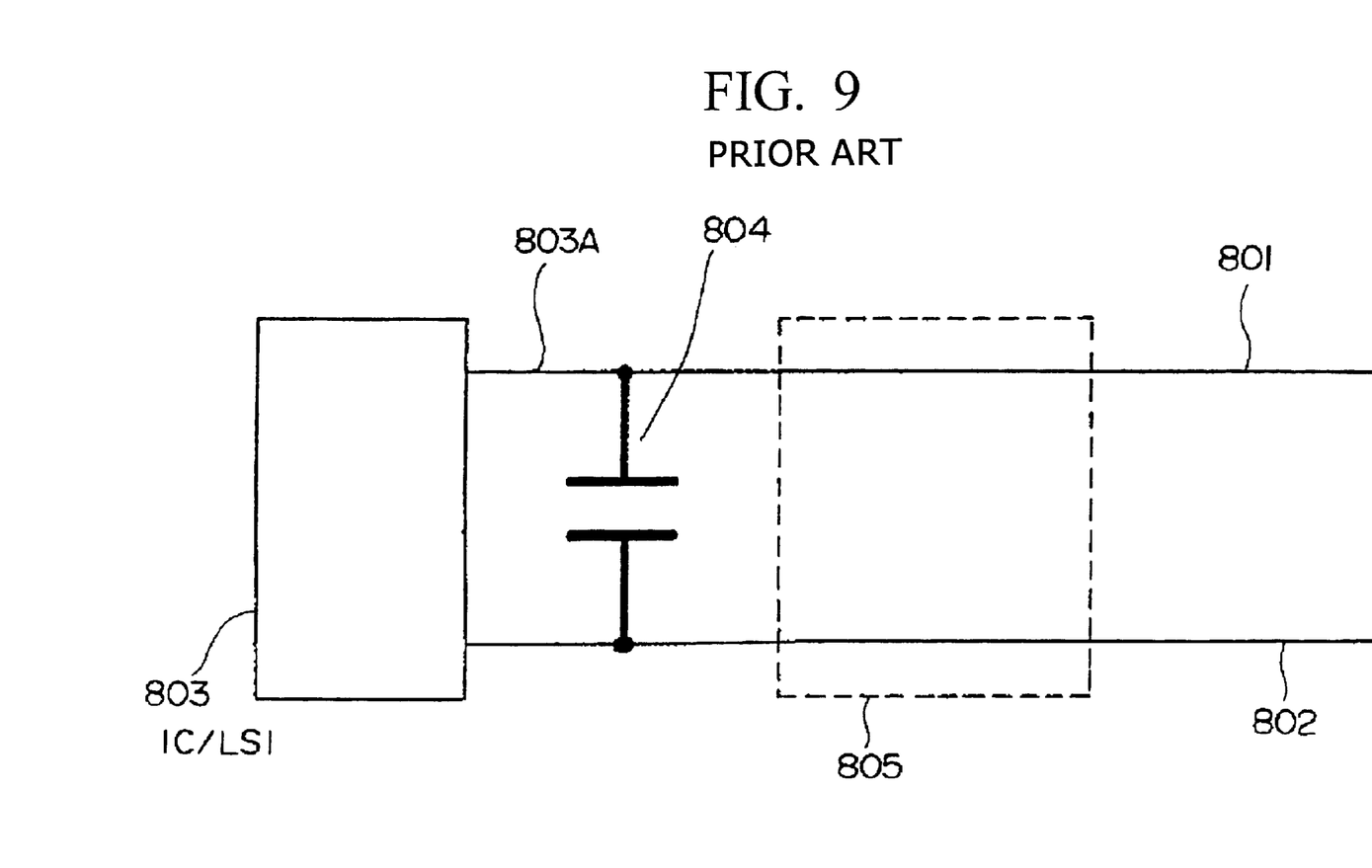
FIG. 9 is a circuit diagram showing a semiconductor device mounted on a multilayer printed circuit board having a whole-area plane source layer and a periphery of a coupling circuit.

The decoupling capacitor 804 allows the high frequency source current, which flows through the source layer 801 depending on the switching operation of the IC/LSI803, to bypass the IC/LSI803. Further, a variation in voltage at a source terminal 803A of the IC/LSI803 caused by the switching operation of the IC/LSI803 can be suppressed.

In the conventional multilayer printed circuit board 805, the source layer 801, which serves as the power supply line, is a planar source layer completely covering the substrate area and comprising a conductive film. The whole-area plane source layer maximizes the area through which the electric current flows, thus reducing the resistance of the power supply line, and decreases linear variations in the source voltage.

Figure 10:
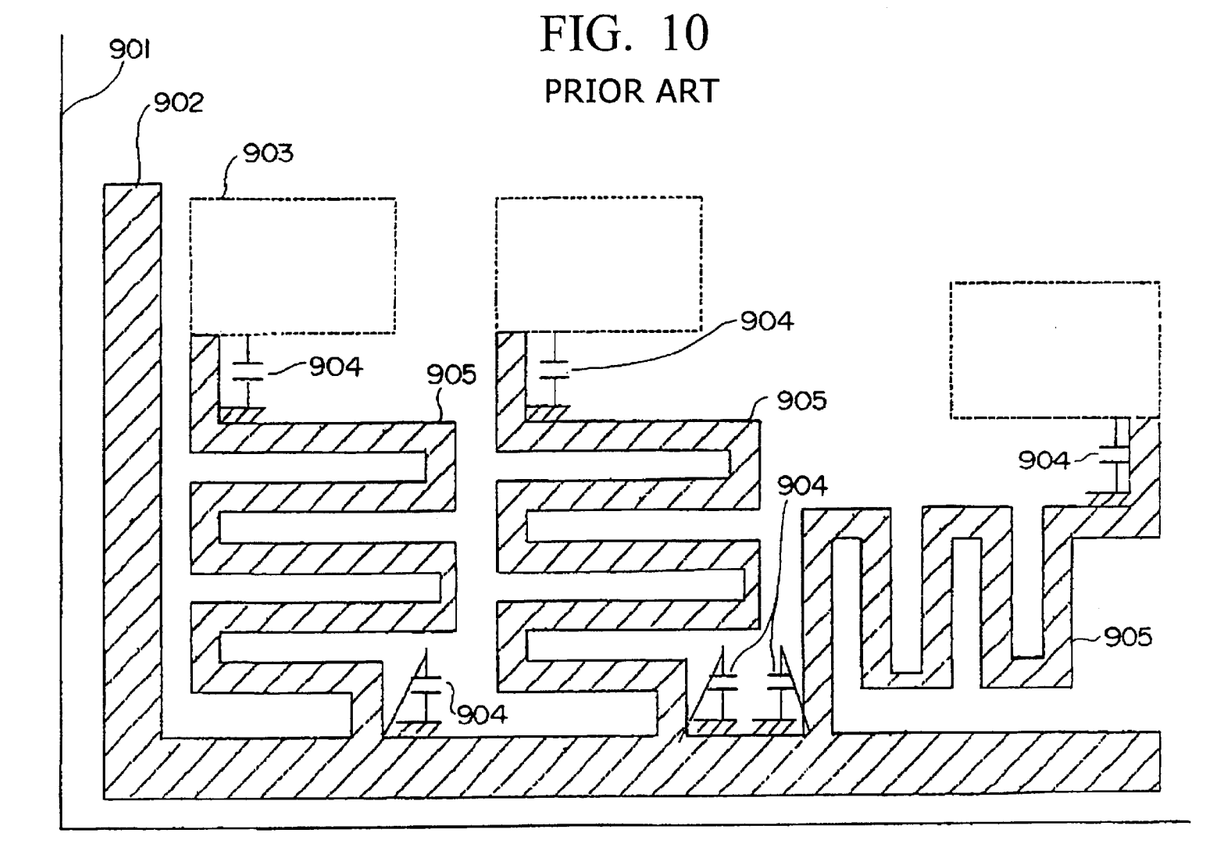
FIG. 10 is a diagram showing an example of a printed circuit board according to the conventional technique.

An EMI suppressing technique for a multilayer printed circuit board has been proposed in which the source layer is formed as lines to control high frequency currents (Japanese Patent Application, First Publication No. Hei 9-139573). FIG. 10 is a plan view showing a principal part of a printed circuit board using this technique, and showing the layout of the source layer on the multilayer printed circuit board 901. On the multilayer printed circuit board 901 shown in FIG. 10, the source layer (hatched area) comprises a number of branch source connections 905 with comb or zigzag shapes which branch from the main line pattern 902 which is a main conductive portion.

Circuit elements (semiconductor integrated circuits) 903 are located at the ends of the branch source lines 905. The power is supplied to the circuit elements 903 through the main line pattern 902 and the branch source connections 905. Decoupling capacitors 904 are provided for the respective circuit elements 903 at the power supply points and at the connection points between the main line pattern 902 and the branch source connections 905.

The conventional example is characterized in that, because the branch source connections 905 act as inductance elements, a comparatively high inductance can be obtained in the power supply circuit for the respective circuit elements 903. Therefore, this technique reduces the source current at high frequencies which is caused by the switching operation of one of the circuit elements 903 and which flows through the decoupling capacitors of the other circuit elements 903, as compared with the conventional printed circuit board. Namely, the source layer of the line patterns acts as a circuit for producing impedance, and enhances the filtering effects of the decoupling capacitors.

The conventional example of the multilayer printed circuit board 805 with the whole-area plane source layer 801 causes the problem that a designer cannot adjust the high frequency source current flowing through the decoupling capacitors 804 to the source layer 801 at the time of switching the IC/LSI803. Because the impedance of the whole-area plane source layer 801 is low, the high frequency source current from the IC/LSI803 flows through not only the decoupling capacitor 804 in proximity of the IC/LSI803 but also the other decoupling capacitors 804 in proximity of the other IC/LSIC803. The distribution of the high frequency source current over the entire multilayer printed circuit board 805 is complicated, and is difficult to analyze. Therefore, the capacities of the decoupling capacitors 804 prepared for the respective IC/LSI803 cannot be specified.

Further, because the source layer 801 forms the whole-area plane, the high frequency source current flows through a complicated path in the source layer 801, and may form a large loop which causes electromagnetic noise.

Figure 11:
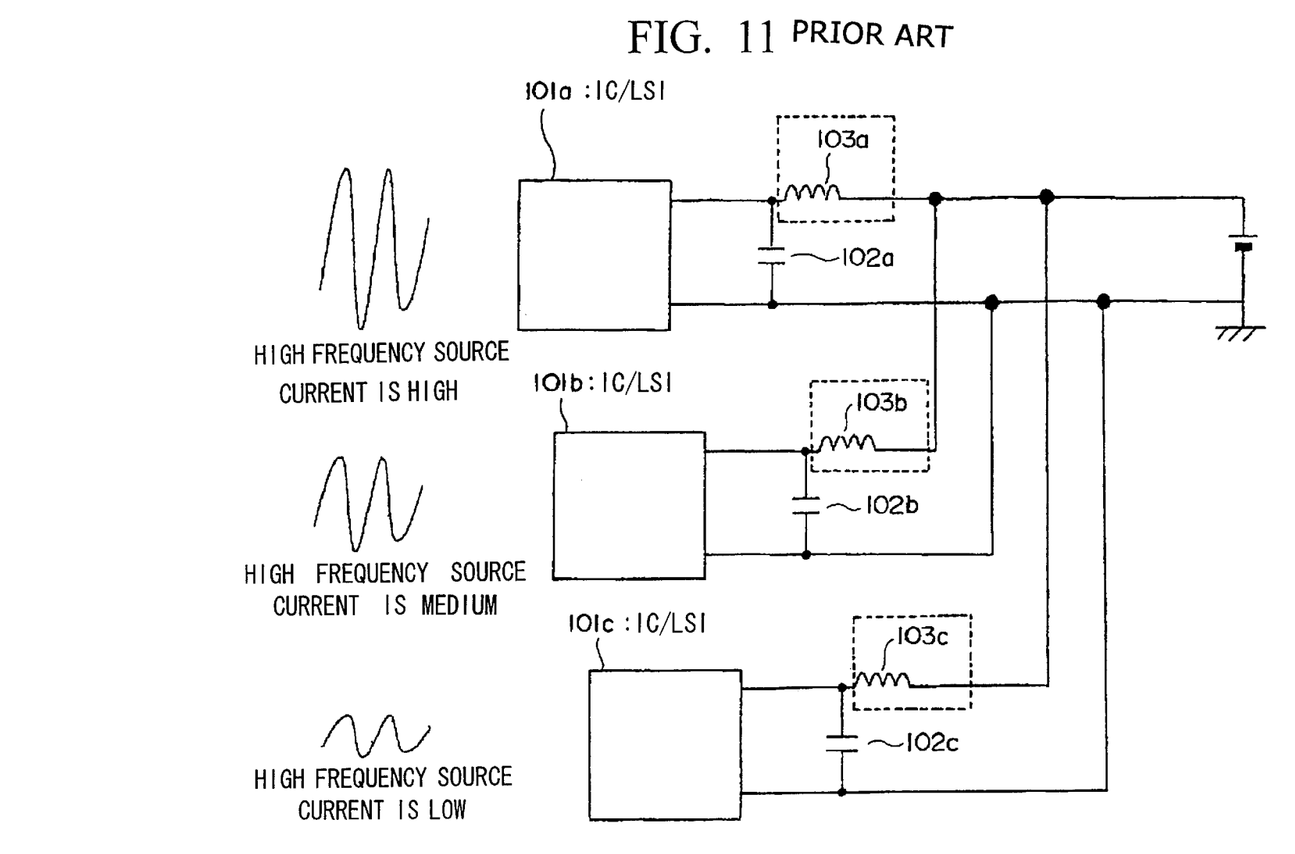
FIG. 11 is a circuit diagram showing an example of a periphery of a plurality of circuit elements connected to a decoupling capacitor.

FIG. 11 is a circuit diagram showing the periphery of a plurality of circuit elements connected to the decoupling capacitors. In this example, an IC/LSI 101a whose high frequency source current is high, an IC/LSI 101b whose high frequency source current is medium, and an IC/LSI 101c whose high frequency source current is low are connected to the power supply line and to the ground in a parallel manner. Decoupling capacitors are provided, depending on the amounts of the high frequency source currents of the IC/LSI 101a to 101c: a decoupling capacitor 102a whose capacity is high (impedance is low) is provided in proximity of the IC/LSI 101a, a decoupling capacitor 102b whose capacity is medium (impedance is medium) is provided in proximity of the IC/LSI 101b, and a decoupling capacitor 102c whose capacity is low (impedance is high) is provided in proximity of the IC/LSI 101c.

As shown in the example of the multilayer printed circuit board 805 with the whole-area plane source layer 801, if the inductances 103a, 103b, and 103c are not provided, the following problem may arise.

Because the impedance of the decoupling capacitor 102c located near the IC/LSI 101c is high, a part of the high frequency source current from the IC/LSI 101c is not released to the ground through the decoupling capacitor 102c, and may flow through the IC/LSI 101a or 101b, increasing the area of the loop of the electric current, and thus increasing the noise due to the electromagnetic radiation.

When the high frequency source current from the IC/LSI 101c is not sufficiently released through the decoupling capacitor 102c, the high frequency source current flows through the other paths, and the source voltage may vary like an alternating current, which may adversely affect the operation of the IC/LSIs.

Further, the conventional technique accommodates the electronic device in the metal case for suppressing the electromagnetic noise to be radiated to the outside of the device. The metal case, however, requires an opening through which a console for the electronic device is provided. Therefore, the conventional technique cannot completely prevent the leakage of electromagnetic noise.

In the multilayer printed circuit board with the source layer of the line patterns, the source layer is equivalent to the inductances 103a, 103b, and 103c as shown in FIG. 11. The decoupling capacitors 102a to 102c near the IC/LSI 101a to 101c allow the high frequency current to bypass the other IC/LSI 803, thereby decreasing the electric current loop.

This technique, however, makes the line patterns of the source layer complicated. To obtain the sufficient inductances, a large area is needed, and the packaging density therefore decreases.

Moreover, the decoupling circuits must be designed for a number of the respective high frequency switching circuit elements and their source-ground terminals, and the number of design steps may be significantly increased. The design of the decoupling circuits requires the data of the high frequency source current of the high frequency switching circuit element (IC, or LSI), and the characteristic impedance and electric current characteristics of the power supply system, which are not in general disclosed by semiconductor manufacturers. Since the values of the high frequency source currents must be estimated, based on the available characteristic data, the decoupling circuits cannot be accurately designed.

Further, the frequency characteristics of the ceramic capacitors used in the decoupling circuit are in general unsatisfactory, and the ceramic capacitors may function as inductors so that the expected decoupling effects cannot be achieved. For example, the resonance frequency of a ceramic capacitor of 0.1 $\mu$F is around 10 MHz, and the ceramic capacitor may function as an inductor when above that frequency. The reason for this is that inductance components such as the electrode pattern of the capacitor and lead wire are present in series with the capacitance.

The parasitic inductance of a general capacitor depends on its dielectric material, electrode pattern structure, and capacitance value, and is approximately 2nH in the case of a chip capacitor, and is approximately 7nH in the case of a capacitor with two terminals and lead wires.

BRIEF SUMMARY OF THE INVENTION

It is therefore an object of the present invention to provide an electromagnetic interference suppressing device and a circuit which can effectively suppress electromagnetic noise radiated around a semiconductor integrated circuit.

It is another object of the present invention to provide an electromagnetic interference suppressing device and a circuit which can suppress variations in source voltage caused by high frequency source currents as a semiconductor integrated circuit operates, to stabilize the operation of the semiconductor integrated circuit.

It is another object of the present invention to provide an electromagnetic interference suppressing device and a circuit which can significantly reduce the number of steps for designing a power supply decoupling circuit, eliminating a complex design process.

It is another object of the present invention to provide an electromagnetic interference suppressing device and a circuit which can significantly reduce the number of steps for designing a power supply decoupling circuit, eliminating a complex design process. The electromagnetic interference suppressing device of the present invention comprises a plurality of connection layers and ground layers formed of a conductive material. The connection layers and the ground layers are alternately layered. Insulating layers formed of an insulating material intervene between the neighboring connection layers and ground layers. The odd connection layers counting from the bottom and the connection layers just above those layers are electrically connected at a first end. The even connection layers counting from the bottom and the connection layers just above those layers are electrically connected at a second end opposite to the first end. The bottommost connection layer is connected to a first signal terminal. The uppermost connection layer is connected to a second signal terminal. The ground layer is connected to a ground terminal.

The electromagnetic interference suppressing circuit of the present invention comprises a plurality of connection layers and ground layers formed of a conductive material. The connection layers and the ground layers are alternately layered. Insulating layers formed of an insulating material intervene between the neighboring connection layers and ground layers. The odd connection layers counting from the bottom and the connection layers just above those layers are electrically connected at a first end. The even connection layers counting from the bottom and the connection layers just above those layers are electrically connected at a second end opposite to the first end. The lowest connection layer is connected to a first signal terminal. The uppermost connection layer is connected to a second signal terminal. The ground layer comprises an electromagnetic interference suppressing device connected to the ground terminal, and a capacitor connected between the first or second signal terminal and the ground terminal. The characteristic impedance of the capacitor are approximately the same as the characteristic impedance of the electromagnetic interference suppressing device between the first or second signal terminal connected to the capacitor and the ground terminal.

The circuit equivalent to the electromagnetic interference suppressing device of the present invention is a structure in which a plurality of coils are connected in series, and in which capacitors, provided by the connection layers and the ground layers, are connected between the connection points of neighboring coils and the ground terminal. Therefore, a lower characteristic impedance of 0.05 to 0.1Ω can be achieved.

In the electromagnetic interference suppressing circuit of the present invention, the electromagnetic interference suppressing device is connected to a capacitor. When the capacitor is a ceramic capacitor, the electromagnetic interference suppressing device is terminated with the same impedance as the characteristic impedance because the equivalent series resistance of the ceramic capacitor is approximately 0.05 to 0.1Ω, thereby reducing reflections in the transmission line.

When the first or second terminal of the electromagnetic interference suppressing device, which is not connected to the capacitor, is connected to the source terminal of a semiconductor device, the source terminal is connected to the ground with a extremely low impedance at high frequencies, and the high frequency source current arising in the semiconductor device immediately bypasses the source terminal through a short loop.

As a result, only a small amount of the high frequency source current produced by the semiconductor device flows through the source conductor, thereby significantly reducing the electromagnetic noise radiated from the source conductor acting as an antenna.

The electromagnetic interference suppressing circuit allows the high frequency source current arising from other semiconductor devices to bypass the semiconductor device connected to the electromagnetic interference suppressing circuit, thereby improving the noise tolerance.

Because only a small amount of the high frequency source current produced by the semiconductor device flows through the source conductor, the alternating variations in the source voltage can be significantly suppressed, thereby stabilizing the operation of the semiconductor device.

Further, the electromagnetic interference suppressing circuit achieves the same function as that of the conventional decoupling capacitor, and can therefore eliminate the conventional decoupling capacitor connected to the source terminal of the semiconductor integrated circuit. The electromagnetic interference suppressing circuit eliminates the design steps of using a decoupling capacitor in consideration of the characteristics of the respective semiconductor circuits, thereby significantly reducing the number of the design steps.

The electromagnetic interference suppressing device basically has the structure in which the conductive layers are layered with the intervening insulating layers, thereby simplifying the structure, lowering the costs, and reducing the size of the device.

Further, because it is not necessary to increase the inductance by the zigzag source connection, the semiconductor devices can be mounted with a high density on the multilayer printed circuit board.

DETAILED DESCRIPTION OF THE INVENTION

The first embodiment of the present invention will be explained with reference to the figures.

Figure 1:
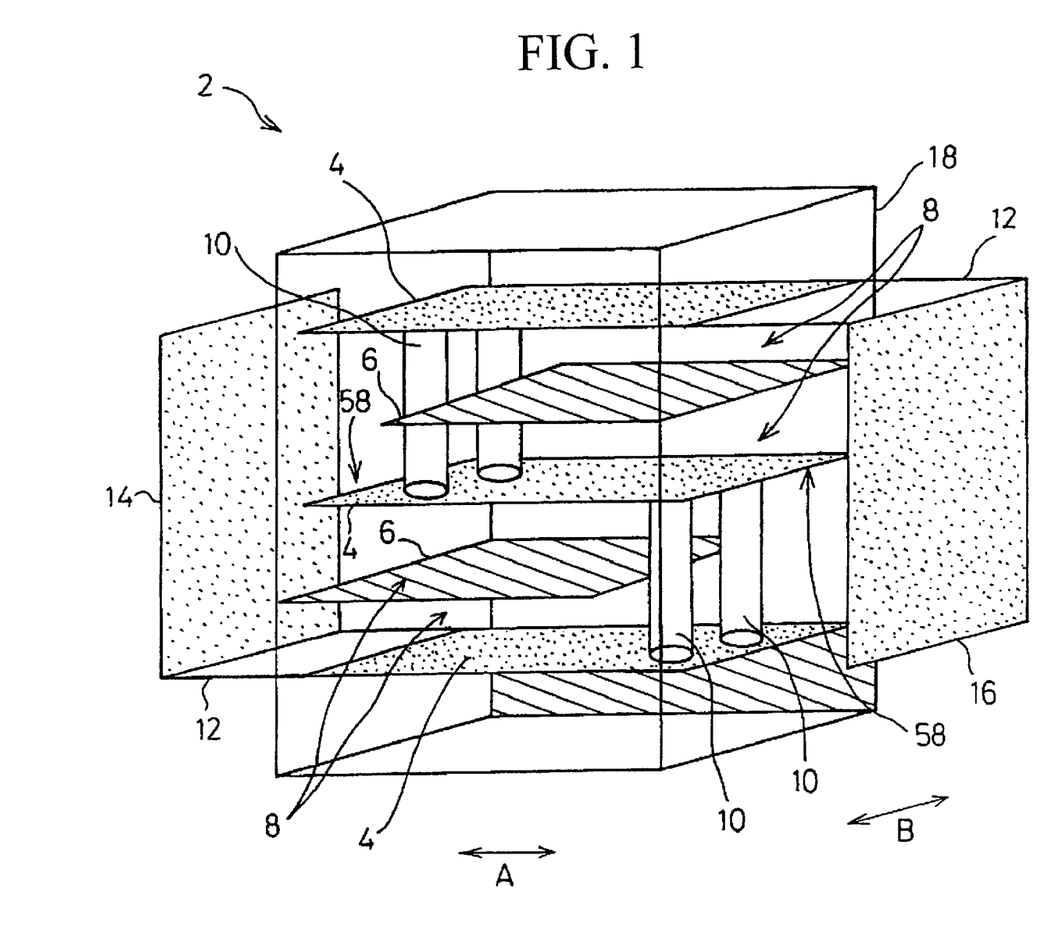
FIG. 1 is a schematic perspective view showing the embodiment of the electromagnetic interference suppressing device of the present invention.

FIG. 1 is a perspective view showing the first embodiment of the electromagnetic interference suppressing device of the present invention.

As shown in FIG. 1, the electromagnetic interference suppressing device 2 comprises a plurality of connection layers 4 of a conductive material, and a plurality of ground layers 6. The connection layers 4 and the ground layers 6 are alternately layered, and insulating layers 8 of an insulating material intervene between the neighboring connection layers 4 and ground layers 6.

The first odd connection layer 4, counting from the underside, and the connection layer 4 just above that layer are electrically connected at the right edge, shown in FIG. 1, via holes 10 (e.g., two holes in this embodiment), filled with a conductive material, which pass through the insulating layer 8. The first even connection layer 4, counting from the under side, and the connection layer 4 just above that layer are electrically connected at the opposite side, that is, at the left edge in FIG. 1 via holes 10. The ground layers 6 are not penetrated by the holes 10, and are mechanically and electrically separated from the holes 10.

The bottommost connection layer 4 is connected via a conductive layer 12 to a first signal terminal 14. The uppermost connection layer 4 is connected via a conductive layer 12 to a second signal terminal 16. The ground layers 6 are connected at their sides to a ground terminal 18.

Specifically, in the first embodiment, the bottommost connection layer 4 is connected to the first signal terminal 14 at the opposite edge (left side) of the connection with the next higher connection layer 4. The uppermost connection layer 4 is connected to the second signal terminal 16 at the opposite edge (right side) of the connection with the next lower connection layer 4.

As described above, the connection layers 4 are connected via holes 10. The electric current flows from the first signal terminal 14, flows from end to end, and reaches the second signal terminal 16. Therefore, the connection layers 4 effectively function as inductance elements.

In the first embodiment, the relative dielectric constant of the insulating material forming the insulating layers 8 is equal to or above 100. The ratio of the inductance component provided by the connection layers 4 to the capacitance component provided by the connection layers 4 and the ground layers 6 is approximately 1:100. The characteristic impedance between the first or second signal terminal 14 or 16 and the ground terminal 18 is 0.05 to 0.1Ω.

For a better understanding of the present invention, FIG. 1 shows only three connection layers 4 and two ground layers 6, but multiple connection layers 4 and ground layers 6 may be possible.

The upper and lower sides of the connection layers 4 are defined for convenience. For example, in FIG. 1, the bottommost connection layer 4 need not be the bottommost layer. When the electromagnetic interference suppressing device 2 is turned upside with respect to the position shown in FIG. 1, the bottommost layer 4 becomes the uppermost layer.

The operation of the electromagnetic interference suppressing device 2 will be explained below with the electromagnetic interference suppressing circuit of the present invention.

Figure 2:
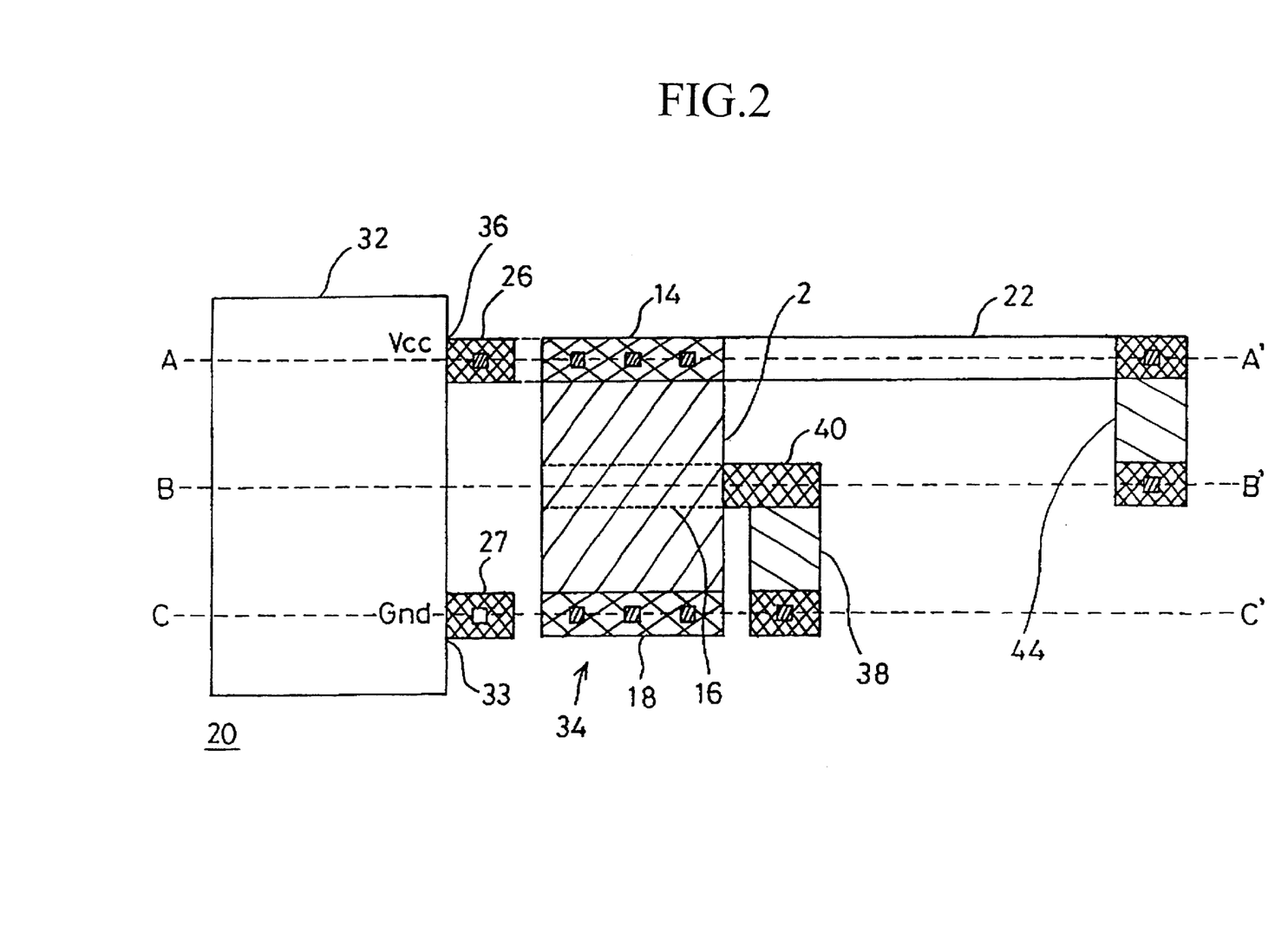
FIG. 2 is a plan view showing the electromagnetic interference suppressing circuit of the present invention mounted on a multilayer printed circuit board.
Figure 3A:
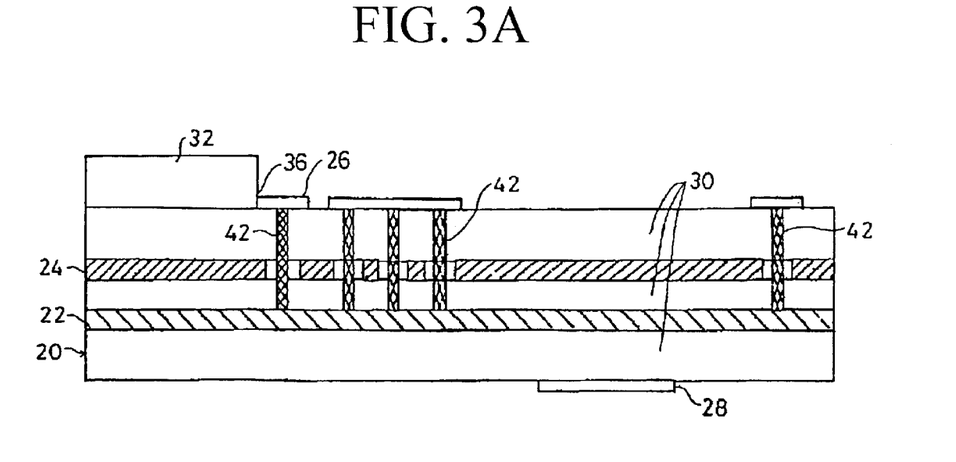
FIGS. 3A to 3C are cross-sectional views along the lines A–A', B–B', and C–C' in FIG. 2.
Figure 3B:
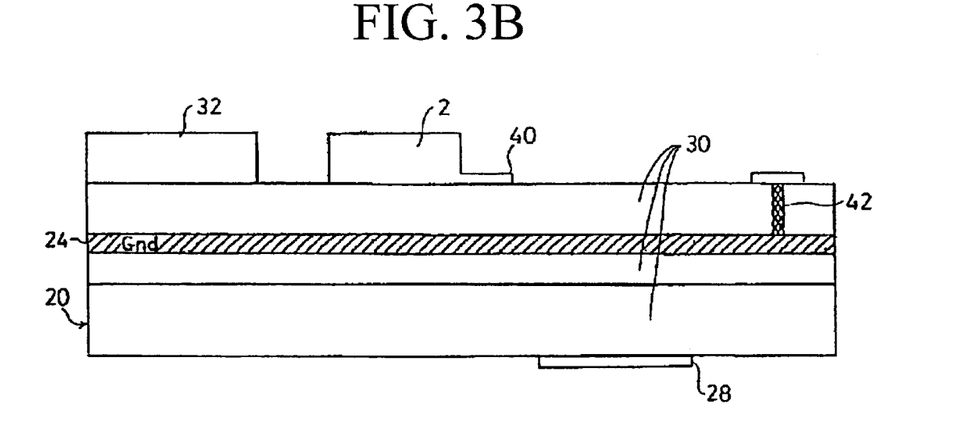
Figure 3C:
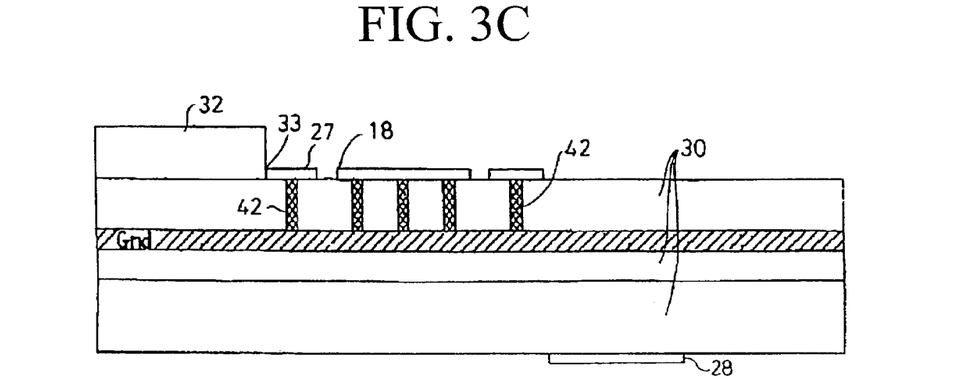

FIG. 2 is a plan view showing the embodiment of the electromagnetic interference suppressing circuit of the present invention which is mounted on a multilayer printed circuit board. FIGS. 3A to 3C are cross-sectional views along the lines A–A', B–B', and C–C' in FIG. 2. In FIG. 2, the same reference numbers as in FIG. 1 are employed to designate like parts.

As shown in FIGS. 3A to 3C, the multilayer printed circuit board used in the embodiment is a printed circuit board 20 with four layers. A source connection 22 is provided in the lower inner layer of the board, and the upper inner layer is a ground layer 24. Connections 26 and 28 are provided on the upper or lower surfaces of the printed circuit board 20. The connections in the layers and the ground layer 6 are separated and insulated from each other by an insulating material layer 30.

As shown in FIG. 2, the semiconductor integrated circuit LSI 32, whose electromagnetic noise is to be suppressed, is mounted on the printed circuit board 20, and the electromagnetic interference suppressing circuit 34 of the embodiment is located in proximity of the LSI 32. As shown in FIG. 3A, a source terminal 36 of the LSI 32 is connected to connection 26 extending on the printed circuit board 20, and connection 26 is connected via holes 42 penetrating through the printed circuit board 20 to the source connection 22. As shown in FIG. 3C, a ground terminal 33 of the LSI 32 is connected to connection 27 on the printed circuit board 20, and connection 27 is connected via holes 42 to the ground layer 24.

The electromagnetic noise suppressing circuit 34 comprises the electromagnetic suppressing device 2 shown in FIG. 1 and a chip capacitor 38. One terminal of the chip capacitor 38 is connected via the connection 40, which is provided on the surface of the printed circuit board 20, to the second signal terminal 16 of the electromagnetic interference suppressing circuit 2. As shown in FIG. 3C, the other terminal is connected via the holes 42, which penetrate through the printed circuit board 20, to the ground layer 24 of the printed circuit board 20. The chip capacitor 38 in this embodiment is a ceramic capacitor whose equivalent series resistance is approximately 0.05 to 0.1Ω.

As shown in FIG. 3A, the first signal terminal 14 of the electromagnetic interference suppressing device 2 is connected via the holes 42, which penetrate through the printed circuit board 20, to the source connection 22 formed in the printed circuit board 20. As shown in FIG. 3C, the ground terminal 18 of the electromagnetic interference suppressing device 2 is connected via the holes 42, which penetrate through the printed circuit board 20, to the ground layer 24 formed in the printed circuit board 20.

In this embodiment, the chip capacitor 44 is located comparatively far from the LSI 32 and the electromagnetic interference suppressing circuit 34. One terminal of the chip capacitor 44 is connected to the source connection 22 via the via holes 42, and the other terminal is connected to the ground layer 24 via the via holes 42.

Figure 4:
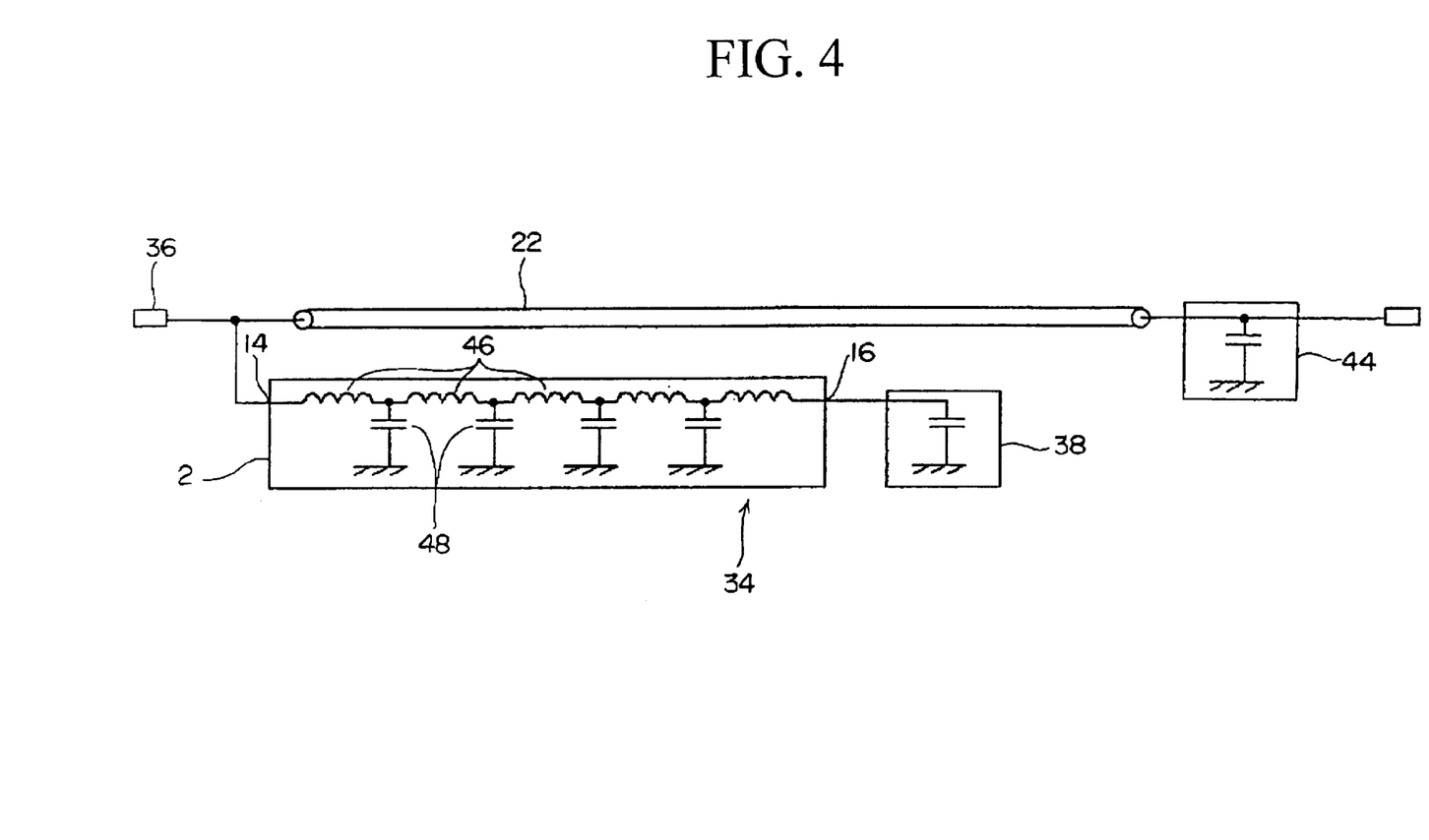
FIG. 4 is a circuit diagram showing the electric circuit around the electromagnetic interference suppressing circuit of the present invention.

FIG. 4 is a circuit diagram showing the electric circuit of the periphery of the electromagnetic interference suppressing circuit 34 of the embodiment. In this figure, the same reference numbers as in FIGS. 2 and 3 are employed to designate like parts.

As shown in FIG. 4, the electromagnetic interference suppressing device 2 is represented by a circuit in which a plurality of coils 46 are connected in series, and in which capacitors 48 are connected between the connection points of two neighboring coils 46 and the ground. The coils 46 correspond to the above-described connection layer 4, and the capacitors 48 correspond to the electrostatic capacity provided by the connection layer 4 and the ground layer 6. A chip capacitor 38 is connected between the second signal terminal 16 of the electromagnetic interference suppressing device 2 and the ground. The first signal terminal 14 of the electromagnetic interference suppressing device 2 is connected to the source terminal 36 of the LSI 32. The numbers of the coils 46 and the capacitors 48 are considered illustrative.

As shown in FIG. 4, the electromagnetic interference suppressing device 2 provides a transmission line in the circuit, and its characteristic impedance is between 0.05 and 0.1Ω as described above. The transmission line is terminated by the chip capacitor 38 of 0.05 to 0.1Ω whose equivalent series resistance is equal to that characteristic impedance. Therefore, the reflection caused by the transmission line is extremely low, and most of the high frequency source current arising from the operation of the LSI 32 flows through the electromagnetic interference suppressing circuit 34 to the ground layer 24 of the printed circuit board 20.

That is, the source terminal 36 of the LSI 32 is connected to the ground with the extremely low impedance in high frequency. The high frequency source current caused by the LSI 32 immediately bypasses the source terminal 36 through a short loop.

As a result, only a small amount of the high frequency source current produced by the LSI 32 flows through the source connection (source conductor) 22, thereby significantly reducing the electromagnetic noise radiated from the source connection 22 acting as an antenna.

Because the electromagnetic interference suppressing device 2 is terminated not by a resistance but by the chip capacitor 38, the direct current does not flow through the electromagnetic interference suppressing circuit 34, preventing the source voltage from being adversely affected.

Figure 5:
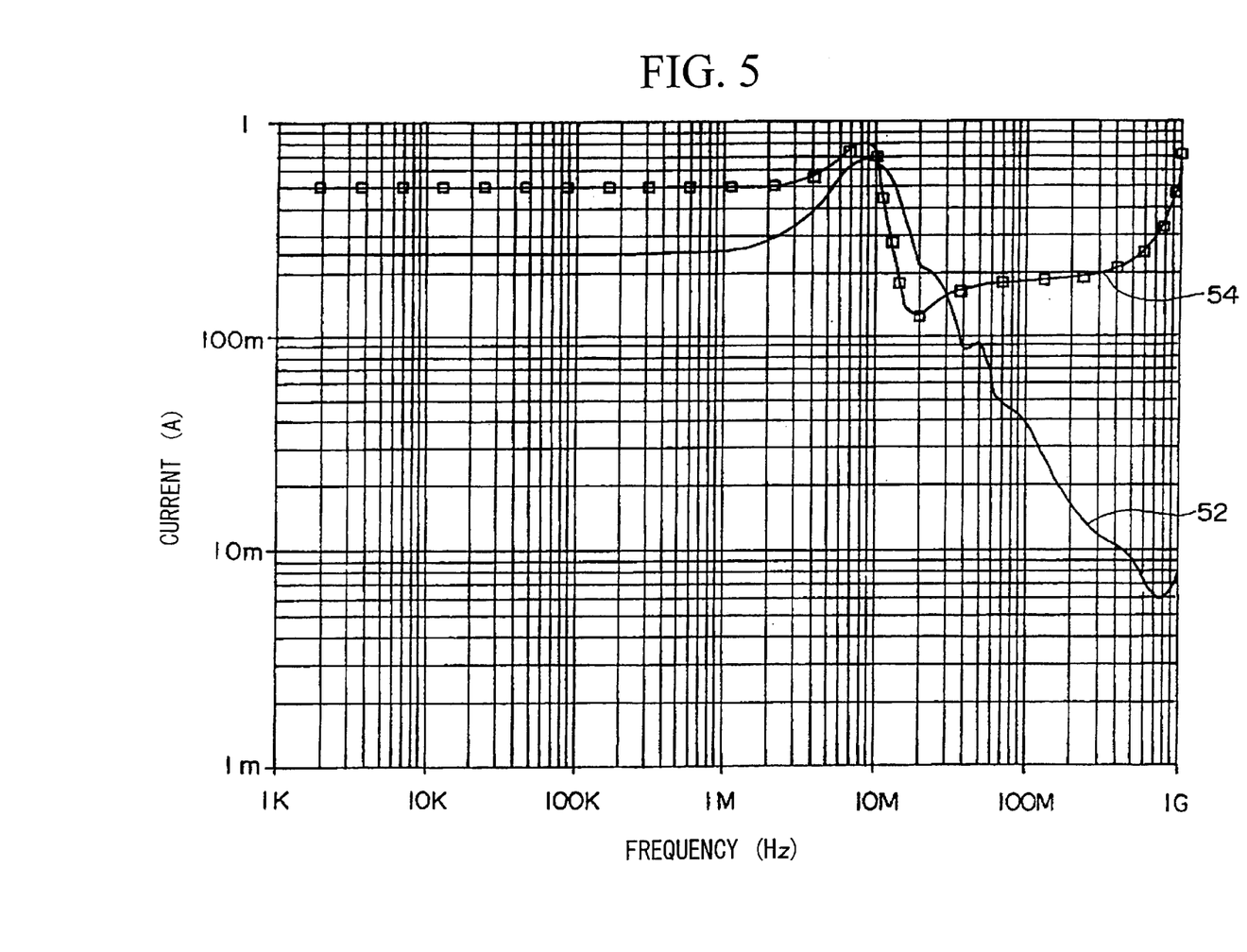
FIG. 5 is a graph showing the results of measurement of the high frequency source current flowing through the source connection when using the electromagnetic interference suppressing circuit of the embodiment.

FIG. 5 is a graph showing the results of measurement of the high frequency source current flowing through the source connection 22 when using the electromagnetic interference suppressing circuit 34 of the embodiment. In this figure, the horizontal axis represents the frequency, and the vertical axis represents the electric current value. The curve line 52 indicates the results of the example using electromagnetic interference suppressing circuit 34, while the curve line 54 indicates the results of the example using only the decoupling capacitor.

As obvious from FIG. 5, the effect is present above 10 MHz, and the high frequency source current is remarkably decreased in the high frequency domain above 100 MHz.

Further, because the electromagnetic interference suppressing circuit 34 allows the high frequency source current, produced by the other semiconductor devices, to bypass the LSI 32, the high frequency source current does not flow through the LSI 32 connected to the electromagnetic interference suppressing circuit 34, thereby improving the noise tolerance.

Because only a small amount of the high frequency source current produced by the LSI 32 flows through the source connection 22, the alternating variations in the source voltage can be significantly suppressed, thereby stabilizing the operation of the LSI 32.

Further, the electromagnetic interference suppressing circuit 34 provides the functions of the conventional decoupling capacitor, thus eliminating the decoupling capacitor connected to the source terminal 36 of the LSI 32. The electromagnetic interference suppressing circuit 34 eliminates the design steps in consideration of the characteristics of the respective semiconductor circuits when using the decoupling capacitor, thereby significantly reducing the number of the design steps. While the embodiment includes the chip capacitor 44 which serves as a decoupling device, the complex design process with the chip capacitor 44 is not necessary as long as the high frequency source current which is significantly reduced by the electromagnetic interference suppressing circuit 34 bypasses the devices.

The electromagnetic interference suppressing device 2 basically has the structure in which the conductive layers are layered with the intervening insulating layers, thereby simplifying the structure, lowering the costs, and reducing the size of the device.

Because it is not necessary to increase the inductance by zigzag source connections 22, the semiconductor devices can be mounted with a high density on the multilayer printed circuit board.

Figure 6:
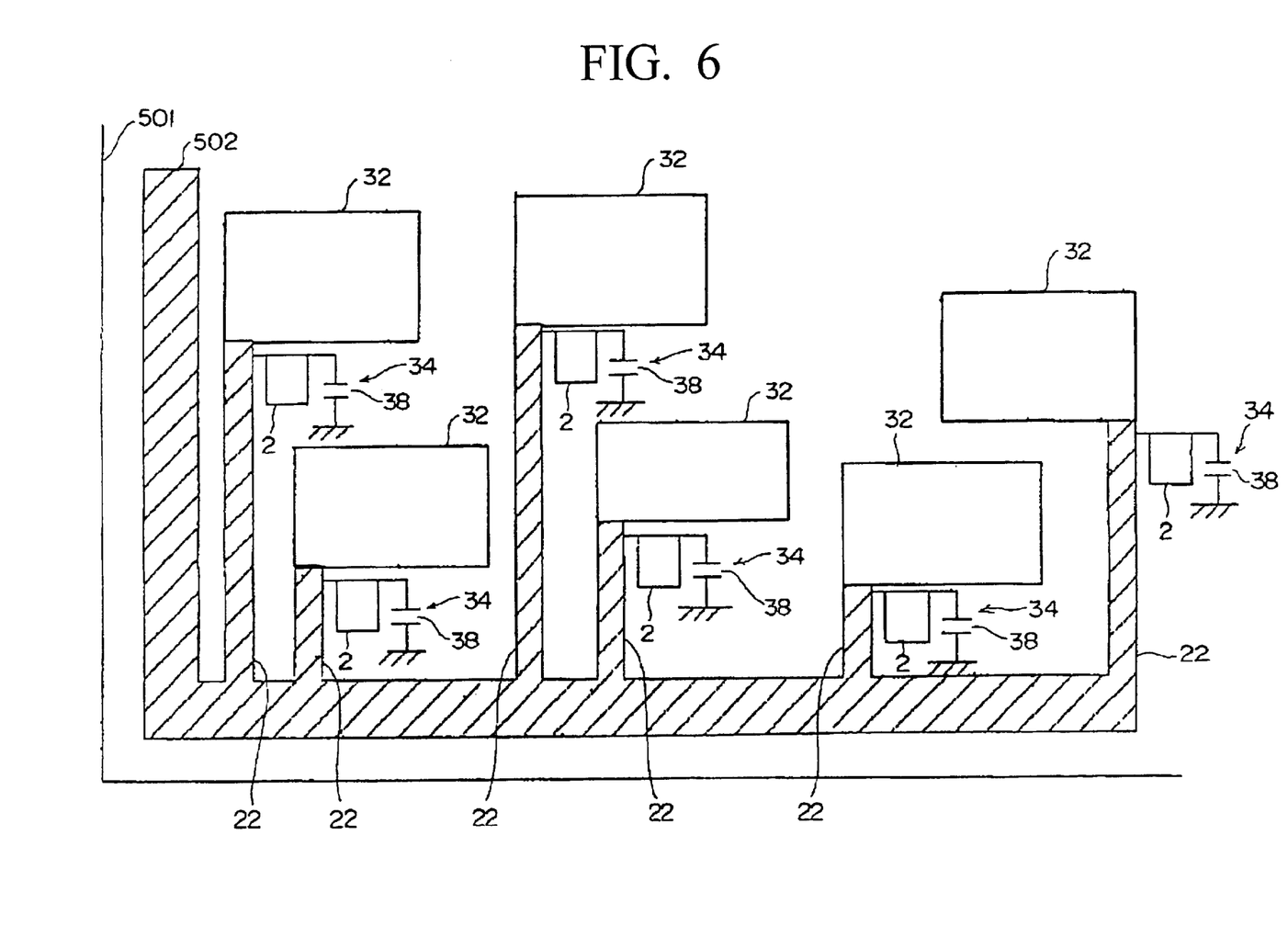
FIG. 6 is a plan view showing a plurality of the LSIs mounted on the printed circuit board and the electromagnetic interference suppressing circuits of the present invention for the respective LSIs.

FIG. 6 is a plan view showing a plurality of the LSIs mounted on the printed circuit board and the electromagnetic interference suppressing circuits for the respective LSIs. In FIG. 6, the same reference numbers as in FIGS. 2 and 3 are employed to designate like parts.

As shown in FIG. 6, a plurality of the LSIs 32 are mounted on the multilayer printed circuit board 501, and the electromagnetic interference suppressing circuits 34 are provided for the respective LSIs 32. The source connection 22 branched from a source main connection 502 does not have to meander. Therefore, the density of the LSIs 32 can be increased as compared with the example shown in FIG. 10.

Next, the second embodiment of the electromagnetic interference suppressing device 2 of the present invention will be explained.

Figure 7:
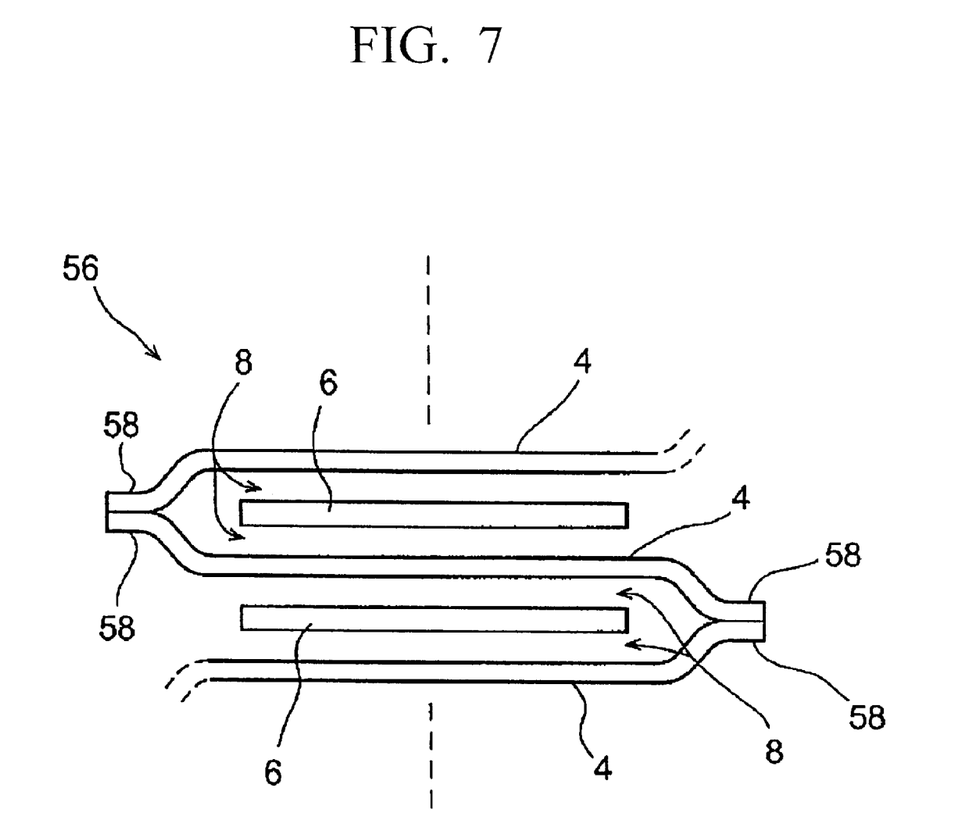
FIG. 7 is a cross-sectional view showing the principal part of the electromagnetic interference suppressing device of the second embodiment of the present invention.

FIG. 7 is a cross-sectional view showing the principal part of the electromagnetic interference suppressing device of the second embodiment of the present invention. In FIG. 7, the same reference numbers as in FIG. 1 are employed to designate like parts.

The difference between the electromagnetic interference suppressing devices 56 and 2 is that the neighboring connection layers 4 are connected without a via hole.

As shown in FIG. 7, there is neither an insulating layer 8 nor a ground layer 6 between connecting ends 58 of the neighboring connection layers 4, and the connecting ends 58 are connected by contacting, compressing, and bonding their facing surfaces. Therefore, the connection layers 4 of the electromagnetic interference suppressing device 56 are electrically equivalent to, and provide the same functions as the connection layers 4 of the electromagnetic interference suppressing device 2.

In the electromagnetic interference suppressing device 56, the neighboring connection layers 4 are connected with a lower resistance because the electromagnetic interference suppressing device 4 does not use a hole 10, and therefore the bypass function of the high frequency source current can be achieved with a low impedance.

Next, the third embodiment of the electromagnetic interference suppressing device of the present invention will be explained.

Figure 8:
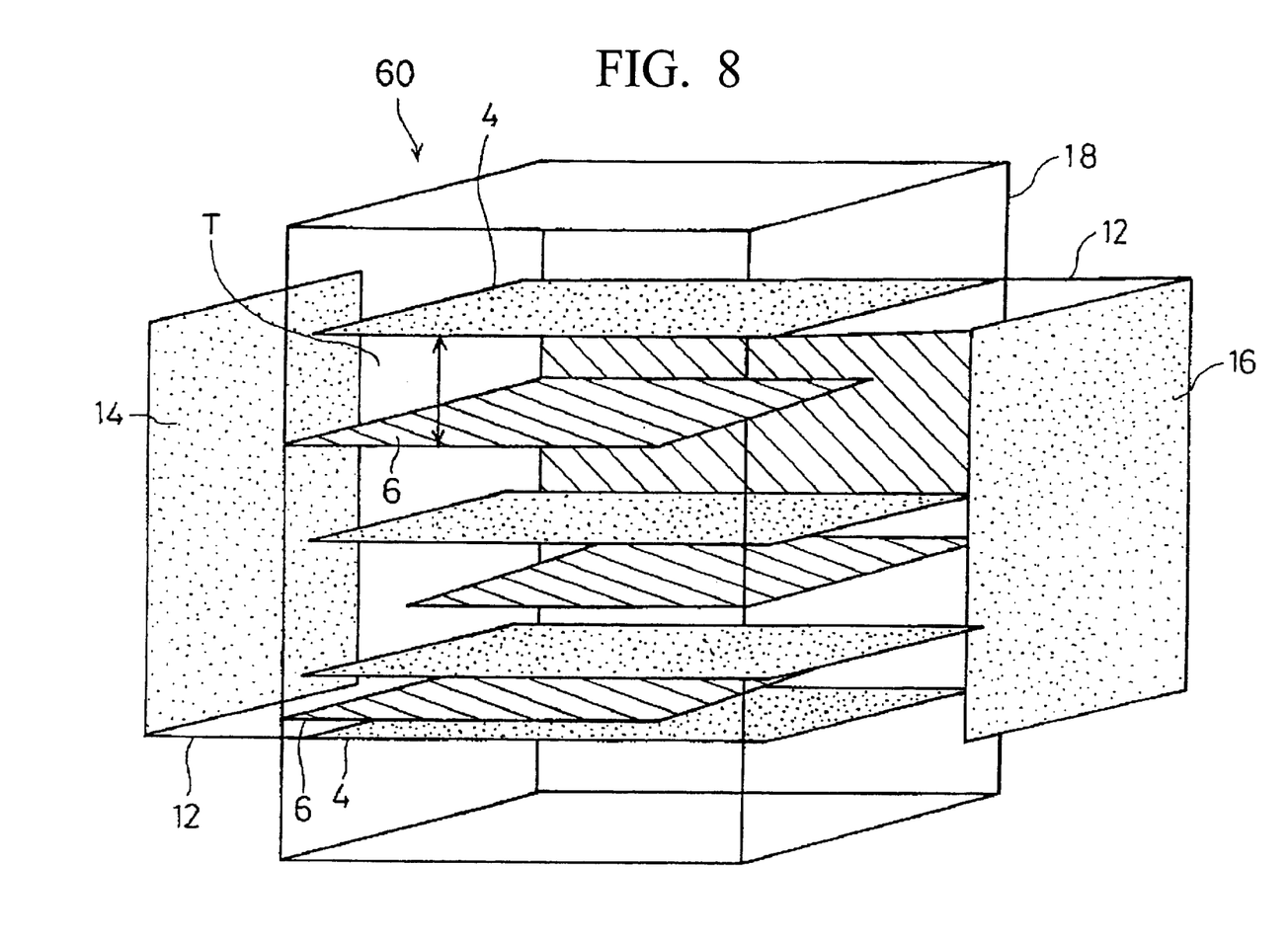
FIG. 8 is a cross-sectional view showing the principal part of the electromagnetic interference suppressing device of the third embodiment of the present invention.

FIG. 8 is a cross-sectional view showing the principal part of the electromagnetic interference suppressing device of the third embodiment of the present invention. In FIG. 8, the same reference numbers as in FIG. 1 are employed to designate like parts, and a detailed description is omitted.

The difference between the electromagnetic interference suppressing device 60 of the third embodiment and the electromagnetic interference suppressing device 2 is that, as shown in FIG. 8, the intervals T between the neighboring connection layers 4 and the ground layers 6 become wider in order of layering from the bottom to the top. The structure can be provided by changing the thickness of the insulating layers 8 intervening between the connection layers 4 and the ground layers 6.

In the electromagnetic interference suppressing device 60, the electrostatic capacities of the connection layers 4 and the ground layers 6 increase toward the first signal terminal 14. Therefore, when the first signal terminal 14 corresponds to the source terminal of the semiconductor circuit, it is considered that a capacitor with a large capacitance is connected near the source terminal of the semiconductor device, thereby improving the performance as a decoupling circuit of the electromagnetic interference suppressing circuit comprising the electromagnetic interference suppressing device 60.

While the intervals between the connection layers 4 become greater from the bottom connection layer 4, conversely, the intervals may become greater from the upper layer of the connection layers 4 to the bottommost connection layer 4. Because the electrostatic capacities can be provided near the second signal terminal 16, the same effect can be obtained when the second signal terminal 16 is connected to the source terminal of the semiconductor device.

In FIG. 8, holes for connecting the neighboring connection layers 4 are omitted for ease in understanding the features.

The same effect of the electromagnetic interference suppressing device 60 can be achieved by gradually changing the widths of the connection layers 4.

In the electromagnetic interference suppressing device 2 shown in FIG. 1, the widths of the intervals between connection layers 4 in the direction perpendicular to the direction (the length of connection layer 4 is indicated by the arrow A, which is also the direction in which the electric current flows) in which the two connecting ends 58 are connected, the intervals between connection layers 4 are gradually widened from the uppermost connection layer 4 toward the bottommost connection layer 4, that is, the intervals become smaller in order of layering from the bottom towards the top. Thus, the electrostatic capacities of the connection layers 4 are increased toward the first signal terminal 14. When the first signal terminal 14 corresponds to the source terminal of the semiconductor circuit, it is considered that a capacitor with a large capacitance is connected near the source terminal of the semiconductor device, and therefore the same effect as that of the electromagnetic interference suppressing device 60 is obtained.

When the widths of the intervals between connection layers 4 are widened toward the uppermost layer, the same effect is obtained.

In the electromagnetic interference suppressing device 2 shown in FIG. 1, the length of the connection layers 4 in the direction in which the two connecting ends 58 are connected, is longer than the width of the two connecting ends in the direction (indicated by the arrow B) perpendicular to that direction. Thus, the electric currents through the neighboring connection layers 4 flow over a long distance, in parallel, and in the reverse direction, and the magnetic fields excited by the currents flowing through the connection layers 4 can be easily cancelled. As a result, the decrease in the inductance of the transmission path formed by the electromagnetic interference suppressing device 2 is prevented, and the bypass function for the high frequency source current can be reliably achieved.

While the electromagnetic interference suppressing device 2 of the first embodiment has the single first signal terminal 14, the single second signal terminal 16, and the single ground terminal 18, the respective terminals may have a plurality of terminals. For example, the ground terminal 18 may have a rectangular hollow shape which contains the connection layer 4 and the ground layer 6, and the four faces may be used as terminals. With this structure, when mounting the electromagnetic interference suppressing device 2 on the printed circuit board, the terminal most suitable for the mounting may be flexibly selected. The first and second signal terminals 14 and 16 may have the same structure.

While in the above embodiment, as shown in FIG. 3, the LSI 32 receives power through the source connection 22, the electromagnetic interference suppressing circuit 34 can provide the same effect when the LSI 32 receives the power through a whole-area plane source layer instead of the source connection 22.

When the semiconductor circuit has a plurality of source terminals 36 and ground terminals 33, the electromagnetic interference suppressing circuits 34 may be provided for pairs of the source terminals 36 and the ground terminals 33, thereby improving the effect.

When the semiconductor circuit has pairs of the source terminal 36 and the ground terminal 33, pairs of the electromagnetic interference suppressing circuits 34 are provided for the pairs of the source terminal 36 and the ground terminal 33, respectively, and the electromagnetic interference suppressing circuits 34 function effectively.

This invention may be embodied in other forms or carried out in other ways without departing from the spirit thereof. The present embodiments are therefore to be considered in all respects illustrative and not limiting, the scope of the invention being indicated by the appended claims, and all modifications falling within the meaning and range of equivalency are intended to be embraced therein.

What is claimed is:

1. An electromagnetic interference suppressing device comprising:
a plurality of connection layers and ground layers formed of a conductive material, wherein
the connection layers and the ground layers are alternately layered,
insulating layers formed of an insulating material intervene between the neighboring connection layers and ground layers;
the odd connection layers counting from the bottom and the connection layers just above those layers are electrically connected at a first end,
the even connection layers counting from the bottom and the connection layers just above those layers are electrically connected at a second end opposite to the first end,
the bottommost connection layer is connected to a first signal terminal,
the uppermost connection layer is connected to a second signal terminal, and
the ground layers are connected to a ground terminal.

2. An electromagnetic interference suppressing device according to claim 1, wherein the bottommost connection layer is connected to the first signal terminal at the end opposite to the end to which said bottommost connection layer is connected to the layer immediately above, and the uppermost connection layer is connected to the second signal terminal at the end opposite to the end to which said uppermost connection layer is connected to the just below layer.

3. An electromagnetic interference suppressing device according to claim 1, wherein at least one of the first signal terminal, the second signal terminal, and the ground terminal has a plurality of terminals.

4. An electromagnetic interference suppressing device according to claim 1, wherein the characteristic impedance between the first or second signal terminal and the ground terminal is 0.05 to 0.1Ω.

5. An electromagnetic interference suppressing device according to claim 1, wherein the relative dielectric constant of the insulating material is equal to or above 100.

6. An electromagnetic interference suppressing device according to claim 1, wherein intervals between the neighboring connection layers and ground layers become smaller or greater in order of layering.

7. An electromagnetic interference suppressing device according to claim 1, wherein widths of the connection layers, in a direction perpendicular to a direction through the first end and the second end, become wider or narrower in order of layering.

8. An electromagnetic interference suppressing device according to claim 1, wherein lengths of the connection layers in a longitudinal direction through the first end and the second end, are longer than the widths of the connection layers in a direction perpendicular to the longitudinal direction.

9. An electromagnetic interference suppressing circuit comprising
an electromagnetic interference suppressing device which comprises:
a plurality of connection layers and ground layers formed of a conductive material, wherein
the connection layers and the ground layers are alternately layered,
insulating layers formed of an insulating material intervene between the neighboring connection layers and ground layers,
the odd connection layers counting from the bottom and the connection layers just above those layers are electrically connected at a first end, the even connection layers counting from the bottom and the connection layers just above those layers are electrically connected at a second end opposite to the first end, the bottommost connection layer is connected to a first signal terminal, and the uppermost connection layer is connected to a second signal terminal, wherein said electromagnetic interference suppressing device is connected to a ground terminal; and said circuit further comprising a capacitor connected between the first or second signal terminal and the ground terminal, wherein the characteristic impedance of the capacitor is approximately the same as the characteristic impedance of the electromagnetic interference suppressing device between the first or second signal terminal connected to the capacitor and the ground terminal.

10. An electromagnetic interference suppressing circuit according to claim 9, wherein the capacitor is a ceramic capacitor.

11. An electromagnetic interference suppressing circuit according to claim 9, wherein the characteristic impedance of the capacitor is 0.05 to 0.1Ω.

12. An electromagnetic interference suppressing circuit according to claim 9, wherein the first or second signal terminal to which the capacitor is not connected is connected to a source terminal of a semiconductor circuit.

13. An electromagnetic interference suppressing circuit according to claim 12, wherein the electromagnetic interference suppressing device, the capacitor, and the semiconductor circuit are mounted on a multilayer printed circuit board in which said source layer, said ground layer, and said signal layer are layered with intervening insulating layers, said source terminal of the semiconductor circuit is connected to the source layer, said ground terminal of the semiconductor circuit is connected to the ground layer of the multilayer printed circuit board, and said ground terminal of the electromagnetic interference suppressing device is connected to the ground layer of the multilayer printed circuit board.

* * * * *